July 5, 1966 E. A. OSIPCHAK ET AL 3,259,805

METALLIC BASED PRINTED CIRCUITS

Filed Feb. 6, 1963

WITNESSES
Theodore F. Wrobel
James F. Young

INVENTORS
Leland L. Kessler
Edward A. Osipchak
BY Alex Mich Jr.
ATTORNEY

United States Patent Office 3,259,805

Patented July 5, 1966

3,259,805

METALLIC BASED PRINTED CIRCUITS

Edward A. Osipchak and Leland L. Kessler, Lima, Ohio, assignors to Westinghouse Electric Corporation, Pittsburgh, Pa., a corporation of Pennsylvania

Filed Feb. 6, 1963, Ser. No. 256,582

7 Claims. (Cl. 317—100)

The present invention relates generally to printed circuit components and more specifically to a printed circuit structure that includes an efficient heat sink or cooling means. Electronic or electrical circuits constructed of planar foil-like conductors printed on or embedded in insulating bases are known in the art as printed circuits. The desired conductor configuration may be produced on commercially available copper clad laminates by known methods such as screening, photo-etching or die-stamping. Such circuits permit the use of simplified wiring and assembly techniques to produce reliable components.

The printed circuit board is supplied with appropriate holes, pads and the like to accommodate the mounting and electrical connection of components, such as diodes and resistors for example, to the conductor configuration. The modules or modular assemblies so produced may be then conveniently incorporated into a larger system, as for example, electronic computers. For some applications environmental conditions may require that each module or modular assembly be encapsulated in a solidified resinous mass for protection and electrical insulation.

As is true with other electrical and electronic components, the modular assemblies, including the printed circuit conductors, generate heat during operation. To provide satisfactory efficiency and life for such components, it is desirable to provide means for dissipating the generated heat. This is especially true in assemblies having a high electronic component density, as a large number of components will generate a large amount of heat. In general, adequate ventilation may be employed to cool electrical assemblies by convection to the surrounding media.

However, where the components or conductors are encapsulated in resinous electrical insulation with inherently poor heat transfer properties, adequate ventilation and convection cooling is not readily available. The same problem exists where electrical components are employed in space applications, for adequate radiation and convection cooling is not available. Where printed circuits with electronic components mounted thereon are encapsulated and are employed in space apparatus, the problem of heat dissipation is obviously compounded.

Accordingly, it is an object of this invention to provide printed circuit structures with efficient cooling or heat dissipating means which employ standardized printed circuit boards.

Another object of this invention is to provide means for conducting heat from a conventional printed circuit structure with electronic components mounted thereon.

Yet another object of this invention is to provide means for conducting heat from a conventional printed circuit to an auxiliary heat sink.

Briefly, this invention accomplishes the foregoing objects by bonding individual flexible printed circuits to an insulated metallic base sheet having a relatively high thermal conductivity. The flexible printed circuit is a composite of a copper foil bonded to a conventional, but thin and flexible base material, such as an epoxy-glass cloth laminate, a linear polyethylene terephthalate film, a fluorocarbon film, a polyamide film or the like. The metallic base sheet has a thin layer of insulation, a solidified resin, deposited thereover. The solidified resin and the flexible base material is thus interposed between the metallic sheet base and the copper planar conductors produced therefrom.

Further objects and advantages of the invention will be apparent as the following description proceeds and features of novelty which characterize the invention will be pointed out in particularity in the claims annexed to and forming a part of the specification. For a better understanding of the invention, reference may be had to the accompanying drawings, in which:

Figures 1, 2, 3, 4:
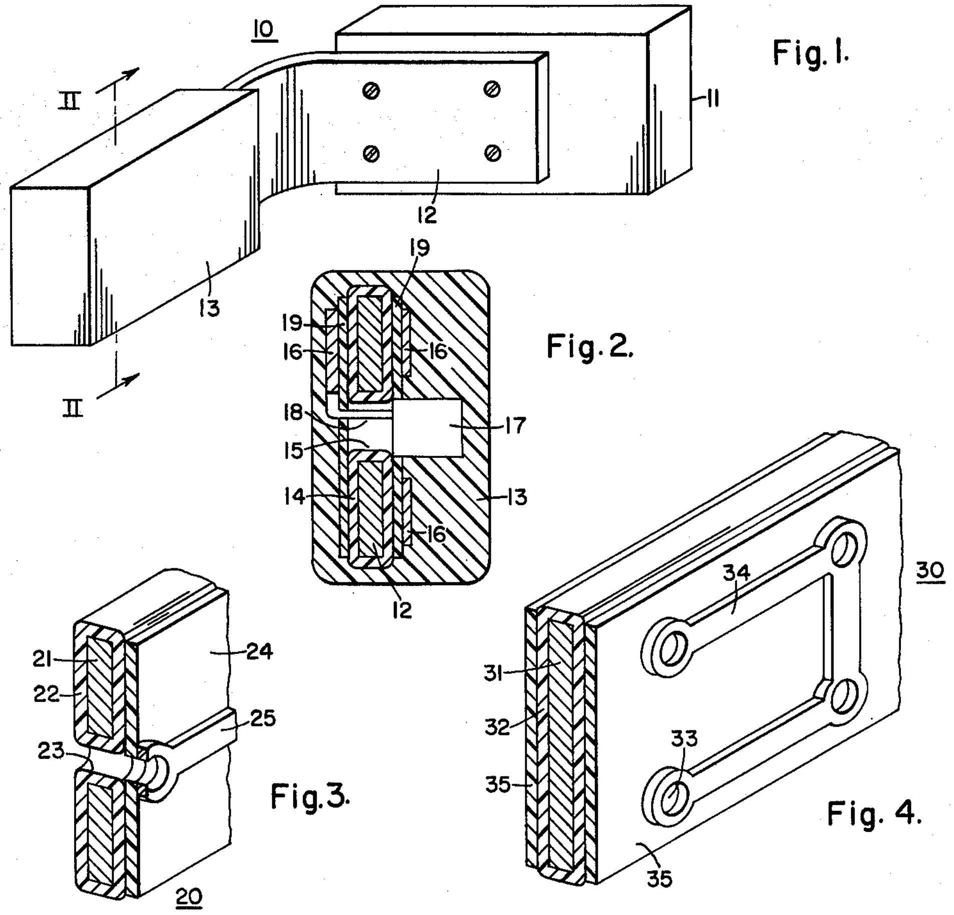
FIGURE 1 is an isometric view illustrating an encapsulated module, including a printed circuit and components mounted thereon, attached to an insulated auxiliary heat sink.
FIG. 2 is a cross-sectional view of FIG. 1 along the line II—II.
FIG. 3 is an isometric view illustrating a conventional etched printed circuit bonded to one side of the insulated metallic base member.
FIG. 4 is an isometric view, partially in cross-section, of conventional etched printed circuit boards mounted on two sides of the insulated metallic base member.

In the attainment of the foregoing objects and in accordance with the present invention, there is provided a metallic base member constructed by forming a desired configuration from a metal, either by casting or by stamping sheet material and punching or drilling the lead holes and the mounting holes for various components. Aluminum is preferred, although other metals having a relatively high thermal conductivity such as copper, steel, or beryllium may also be employed. Preferably, the base is constructed by punching and stamping an aluminum sheet. All of the holes are punched to a predetermined oversized diameter to compensate for the thickness of a coating of resinous insulating material which will be applied to the metallic sheet.

Employed fluidized bed techniques, the punched and formed metallic base is coated with an adherent layer of resinous material so that all sides are covered and all holes have resinous material deposited therethrough. Where no resinous coating is desired, areas may be masked before coating or the coating may be removed at some later time. The uncoated portion of the metallic member may be employed as a means for mounting to an auxiliary heat sink. The base member may be described as having a first coated portion and a second uncoated portion. The coating thickness is kept to a minimum, consistent with required electric strength, the desired thermal conductivity and the required deposition of insulation on the interior surfaces of the holes.

Fluidized beds for depositing resinous coatings are acknowledged as known in the art. Suitable techniques which may be employed in this invention, are described in detail in German Patent No. 933,019 and U.S. Patent No. 2,844,489, for example. A gas, usually air, is injected upwardly through a foraminous plate into a bed of powdered resin. The injection of gas causes the dry powder to be suspended in the tank and the suspended powder assumes the characteristics of a fluid. The metal base plate with appropriately sized holes therethrough, is introduced into the fluidized resin bed while the base is at a temperature above the melting point of the resin to be applied. The plate is immersed for a period of about 2 to 15 seconds. The resinous particles contacting the heated plate will fuse and adhere to all exposed surfaces including the interior surfaces of the holes.

Other coating methods may be employed as long as the particular technique produces a relatively uniform coating of resinous insulation on the interior surface of the mounting holes. It should be noted that the fluidized bed technique, described in U.S. application Serial No. 238,097, filed November 16, 1962, assigned to the assignee of this invention, also produces a continuous coating on corners, edges and burrs that is free of pin holes. This freedom from pin holes and other like ruptures in the insulation is significant in the above mentioned application. While a continuous coating of insulation is desirable in this invention, it will be apparent that freedom from pin holes, ruptures and the like is not as critical and that structures with greater reliability may be produced. In this invention, ruptures in the coating on the interior surfaces of the holes may be easily filled and repaired.

While other insulating resinous materials may be employed, epoxy resins are preferably employed to coat the metallic base member because of advantageous heat transfer properties. Epoxy resins are typically complex mixtures of glycidyl polyethers, the simplest, for example, being a diglycidyl diether of a dihydric phenol which contains a single divalent aromatic hydrocarbon radical from the dihydric phenol and has two glycidyl radicals linked thereto by ethereal oxygen atoms. More generally, the polyether is of more complex character and contains two or more aromatic hydrocarbon radicals alternating with glyceryl groups in a chain linked together by intervening ethereal oxygen atoms. These epoxy resins are generally described in the art as aromatic base glycidyl polyethers. A satisfactory heat flow will be produced where the epoxy coating on the metallic base member is limited to a maximum of about 11 mils.

Conventional composite printed circuit boards are made by bonding an insulating base sheet and copper foil together. The copper foil may be bonded to only one side of the insulating sheet or the insulating sheet may be sandwiched between two sheets of foil. It will be apparent that the former type is advantageously employed in this invention. The composite boards employ many types of insulating materials for the base sheet, as for example, phenolic-paper laminates, extruded synthetic polymeric films and the like.

In this invention, epoxy-glass laminates and copper bonded together to form a thin flexible composite are preferred. Other flexible insulating materials as for example, linear polyethylene (glycol) terephthalate films, known by the trademark "Mylar," may be employed. Insulating base sheets up to about 10 mils in thickness are satisfactory. These flexible base sheets, which of course produce flexible composite printed circuit boards, are especially adaptable to high speed circuit etching facilities. Moreover, the thin laminates, particularly the epoxy-glass laminates, have thermal conductive properties which permit satisfactory cooling of the planar conductors and mounted components.

If an 11 mil coating of fluidized epoxy is employed over the metallic base sheet, its thermal resistance is about 1.5° C./watt. If a 5 mil epoxy-glass laminate is used as a base for the copper foil and is bonded to the fluidized coating, an additional 1.0° C./watt of thermal resistance is added. This is a total thermal resistance of about 2.5° C./watt to the metallic base. The metallic base is, in itself, a heat sink. The metallic base may be connected to an auxiliary heat sink, if the component density is high and a large amount of heat is developed during operation. In either case, conduction alone may be relied on for cooling.

Since the individual flexible printed circuits may be checked for quality and dimensions prior to assembly on the metallic base, only the unsatisfactory printed circuits are discarded. Where the foil is bonded directly to the fluidized coated metal sheet and then etched, the entire assembly is discarded if the printed circuit is unsatisfactory after etching. In producing double sided printed circuits where the foil is bonded directly to the coated metal base, the entire structure must be discarded when a defect appears on one side. This problem is essentially eliminated if the flexible printed circuit is employed according to this invention.

The metallic base in this invention, as in that described in U.S. application Serial No. 238,097, filed November 16, 1962, is preferably fabricated from aluminum. Copper foil is most advantageously employed, in both instances, as the planar conductive material. However, copper and aluminum have different coefficients of expansion. Repeated heating and cooling cycles induce stresses in the printed circuit structure that may result in some separation or bond failure, particularly between the narrow planar copper conductor produced by etching and the fluidized insulating coating. It has been found that the interposition of the intermediate layer of resinous insulating material, such as the epoxy-glass laminate, results in a higher bond strength and a consequent reduction in or elimination of the possibility of separation of the planar conductors.

When copper foil is bonded or cemented directly to the resinous material deposited on the metallic base with an adhesive, it is possible for the adhesive to fill the holes punched in the base. It is apparent that the adhesive must be cured before the composite is etched. Cleaning the holes after the bonding agent has set is a difficult operation. The pre-etched flexible printed circuit, however, may also be pre-punched and the bonding agent may easily be removed from the holes before curing, as for example, by directing an air blast therethrough. Moreover, where the circuit is etched and punched prior to bonding to the resinous insulated metallic base, the holes in the circuit and the insulated base can be aligned by visual or simple mechanical means.

In FIG. 1, there is illustrated a mounted modular component 10. The module 10 is mounted to an auxiliary heat sink 11 by means of an uncoated portion of the metal base plate 12 which extends beyond the resin encapsulated portion 13. As is illustrated more clearly in FIG. 2, the metallic base plate 12 is coated with an insulating resinous material 14, essentially free from pin holes and the like, to provide adequate dielectric strength. The insulating resinous material provides a continuous coating including a deposition through the mounting hole 15.

The pre-etched and pre-punched flexible printed circuit comprised of the planar copper conductors 16 and the flexible insulating sheet 19 is bonded to the resinous insulating material 14, as will be apparent from FIG. 2. A component 17 is electrically connected to the planar copper conductor by means of a lead 18. It should be noted that providing a lead insulated with sleeving or the like is not equivalent to insulating the interior surface of the hole 15, as failure is more likely to occur with such leads.

In FIG. 3, we have illustrated a printed circuit structure with a circuit on one side of a metal plate 21 coated with an insulating resinous material 22 including the deposition of an insulating layer through the hole 23. A pre-insulated, pre-punched flexible printed circuit is bonded to the resinous material 22 and is comprised of a flexible insulation 24 and planar conductors 25.

FIG. 4 illustrates a printed circuit structure designed for conductive cooling by means of a metallic base 31 which is coated with a resinous insulating material 32. A pre-etched, pre-punched flexible circuit 34, 35 is bonded to each side of the insulated base so that the holes 33 of the planar conductor are aligned with a corresponding hole in the coated metallic base.

Figure 5:
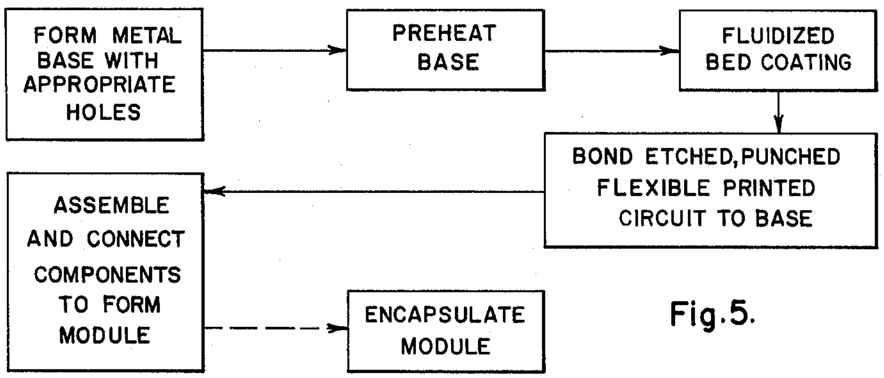
FIG. 5 is a schematic diagram illustrating the process steps employed in making the printed circuit structures of this invention.

FIG. 5 is a general schematic illustration of the method employed in producing printed circuit boards according to this invention. A metal base is cut and/or formed to desired shape with appropriate holes. The shaped metal base is heated and immersed in a fluidized resious particle bed so that a resinous coating is fused to the member. The temperature to which the base should be heated will be influenced by variables such as shape, size of the base, time elapsed before the base is immersed in the fluidized resin and the particular resin employed.

When immersed in the fluidized resin, the temperature of the base must be such that the resin particles will fuse and adhere to the surface of the base. This may be easily determined by a number of trial runs on any particular base.

A flexible printed circuit is prepared by etching the desired planar conductor configuration by methods known in the art. Appropriate holes are punched in the circuit. The holes in the printed circuit are aligned with corresponding holes in the insulated metallic base after an adhesive has been applied therebetween. Excess adhesive that may have flowed into the holes is removed. The adhesive is cured under appropriate conditions of pressure and temperature to firmly bind the circuit to the base. Mounting and connecting the components to the conductors and, if required by environmental conditions, the resin encapsulation of the module may be accomplished by methods known in the art. It should also be noted that adhesives commonly employed in the printed circuit may be employed although epoxy base materials are preferred from the standpoint of thermal conductivity.

The following example is illustrative of the preparation of the printed circuit structure in accordance with the invention.

A sheet of aluminum 0.063 inch thick is formed to have a right angle flange. Mounting and terminal holes are punched in the sheet. The flange area is masked to prevent deposition of the resinous coating on the metal. The sheet is preheated to a temperature of 300° C. A fluidized resin bed is prepared employing a finely divided B-stage epoxy resin having an average particle size of 325 mesh. The epoxy resin has a molecular weight of about 1050 and an epoxide equivalent of about 525. In this example, a proprietary commercial epoxy resin identified as Armstrong E–201 is employed.

Immediately after heating, the sheet is immersed in the fluidized bed and removed after about 1 or 2 seconds. An epoxy coating about 11 mils thick is deposited on all exposed surfaces of the aluminum sheet. A uniform adherent continuous coating is deposited on the interior surface of the holes as well as on corners and edges of the sheet. The epoxy coating will have a dielectric strength in excess of 2000 volts and a thermal resistance of 1.5° C./watt which is far superior to equivalent coatings of other resins.

An epoxy base adhesive, for example Westinghouse No. 7H80, about 0.0005 inch thick is applied to the surface of the resin coated aluminum base sheet. An etched and punched copper clad epoxy laminate, about 6 mils thick is coated with the adhesive, a film of about 0.0005 inch thick being applied. The adhesive is partially cured, the two surfaces are pressed together, excess adhesive is removed from the holes and the adhesive is cured.

While there have been shown and described what are at present considered to be the preferred embodiments of the invention, modifications thereto will readily occur to those skilled in the art. It is not desired, therefore, that the invention be limited to the specific arrangement shown and described and it is intended to cover in the appended claims all such modifications as fall within the true spirit and scope of the invention.

We claim as our invention:

1. An electrically insulated thermally conductive printed circuit structure comprising, in combination, a shaped metallic base member having a first planar surface area and a flange portion extending angularly from the first planar area to form a second planar surface area, an adherent thin essentially rupture free uniform continuous resinous insulating coating deposited on the first surface area, said second surface area being uncoated so that heat may be conducted therefrom and a thin flexible printed circuit composite bonded to the first surface area, said printed circuit comprising planar conductors affixed to a thin insulating sheet.

2. An electrically insulated thermally conductive printed circuit structure comprising, in combination, a shaped metallic base member having a first planar surface area and a flange portion extending angularly from the first area to form a second planar surface area, an adherent essentially rupture free continuous coating of fused resin deposited on the first surface area and a flexible printed circuit bonded to the first surface area, said printed circuit comprising planar conductors affixed to an insulating sheet.

3. A modular unit having electronic components mounted to a printed circuit structure and electrically connected by planar conductors of the circuit comprising, in combination, a metallic base member having a first planar surface with holes extending therethrough, a flange portion extending angularly from the first planar surface to form a second planar surface, an adherent thin essentially rupture free uniform continuous resinous insulating coating applied to the first planar surface including the hole surfaces, the second planar surface being uncoated, an insulating sheet bonded to the coating, planar electrical conductors bonded to the insulating sheet, electronic components mounted on the first planar surface and extending into said holes and being electrically connected by the planar conductors whereby the electronic components and planar conductors are conductively cooled by the metallic base member.

4. A modular unit adapted for conductive cooling having electronic components mounted on a printed circuit structure and electrically connected by planar conductors of the circuit comprising, in combination, a shaped metallic base member having a first planar surface, a flange portion extending from said first surface to form a second planar surface, an adherent essentially rupture free continuous coating of fused epoxy resin coating applied to the first surface of the base member, an epoxy resin impregnated insulating base sheet bonded to the coating, planar electrical conductors bonded to the insulating base sheet, electronic components mounted on the base sheet and electrically connected by the planar conductors, said second surface of the metallic base sheet being uncoated and adapted for connection to an auxiliary heat sink whereby the electronic components and planar conductors may be conductively cooled by the second portion of the base sheet and the auxiliary heat sink.

5. The modular unit of claim 4 wherein said first portion of the metallic base member and electronic components and planar conductors mounted thereon are encapsulated in a solidified resinous insulating material.

6. The printed circuit structure of claim 2 in which the resin is an epoxy resin.

7. The modular unit of claim 4 in which the base member is an aluminum base member.

References Cited by the Examiner

UNITED STATES PATENTS

| | | | |
|---|---|---|---|
| 2,773,239 | 12/1956 | Parker. | |
| 2,837,619 | 6/1958 | Stein. | |
| 2,923,860 | 2/1960 | Miller. | |
| 2,943,956 | 7/1960 | Robinson | 174—68.5 X |
| 2,974,284 | 3/1961 | Parker | 174—68.5 X |
| 3,136,650 | 6/1964 | Avila. | |
| 3,165,672 | 1/1965 | Gellert | 174—68.5 X |

FOREIGN PATENTS

| | | |
|---|---|---|
| 220,363 | 2/1959 | Australia. |

OTHER REFERENCES

Davidson, "Designing Potted Circuits," published in Electronic Design, March 1955, pages 38 and 39.

ROBERT K. SCHAEFER, *Primary Examiner.*

JOHN P. WILDMAN, JOHN F. BURNS, *Examiners.*

D. L. CLAY, *Assistant Examiner.*